(12) United States Patent
Kanehara et al.

(10) Patent No.: US 10,623,676 B2
(45) Date of Patent: Apr. 14, 2020

(54) IMAGING DEVICE AND CAMERA SYSTEM

(71) Applicant: Panasonic Intellectual Property Management Co., Ltd., Osaka (JP)

(72) Inventors: Hidenari Kanehara, Kyoto (JP); Norihiko Sumitani, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 51 days.

(21) Appl. No.: 16/005,758

(22) Filed: Jun. 12, 2018

(65) Prior Publication Data
US 2019/0007641 A1 Jan. 3, 2019

(30) Foreign Application Priority Data
Jul. 3, 2017 (JP) .................................. 2017-130392

(51) Int. Cl.
*H04N 5/335* (2011.01)
*H03M 1/12* (2006.01)
(Continued)

(52) U.S. Cl.
CPC ..... *H04N 5/3745* (2013.01); *H01L 27/14643* (2013.01); *H04N 5/23229* (2013.01);
(Continued)

(58) Field of Classification Search
CPC .. H04N 5/3745; H04N 5/23229; H04N 5/341; H04N 5/3575; H04N 5/3577;
(Continued)

(56) References Cited

U.S. PATENT DOCUMENTS 8,035,717 B2   10/2011   Hisamatsu
2008/0284885 A1   11/2008   Taura
(Continued)

FOREIGN PATENT DOCUMENTS

JP   2002-140044   5/2002
JP   2003-273852   9/2003
(Continued)

*Primary Examiner* — Sinh Tran
*Assistant Examiner* — Selam T Gebriel
(74) *Attorney, Agent, or Firm* — McDermott Will & Emery LLP

(57) ABSTRACT

An imaging device includes: a pixel that outputs a pixel signal corresponding to incident light; a comparator that compares the pixel signal with a reference signal and generates an output signal that indicates a comparison result; a counter that generates a digital signal corresponding to the pixel signal by counting the number of periods until the output signal is inverted, the counter including first to fourth counter parts, each of which corresponds to one of bits included in the digital signal; a memory that stores the digital signal, the memory including first to fourth memory parts corresponding to the first to fourth counter parts; and first and second lines. The first and third counter parts are respectively connected to the first and third memory parts through the first line. The second and fourth counter parts are respectively connected to the second and fourth memory parts through the second line.

10 Claims, 11 Drawing Sheets

(51) Int. Cl.
  *H04N 5/3745* (2011.01)
  *H04N 5/232* (2006.01)
  *H04N 5/341* (2011.01)
  *H01L 27/146* (2006.01)
  *H04N 5/357* (2011.01)
  *H04N 5/378* (2011.01)

(52) U.S. Cl.
  CPC ........... *H04N 5/341* (2013.01); *H04N 5/3575* (2013.01); *H04N 5/3577* (2013.01); *H04N 5/378* (2013.01)

(58) Field of Classification Search
  CPC ........ H04N 5/378; H04N 5/232; H04N 5/335; H04N 5/374–37457; H01L 27/14643–14663; H03M 1/56
  See application file for complete search history.

(56) References Cited

U.S. PATENT DOCUMENTS

| | | | |
|---|---|---|---|
| 2013/0063627 A1* | 3/2013 | Hashimoto | H04N 5/378 348/241 |
| 2013/0121455 A1 | 5/2013 | Koyama | |
| 2016/0309107 A1 | 10/2016 | Sumitani et al. | |
| 2016/0366359 A1* | 12/2016 | Lee | H04N 5/378 |

FOREIGN PATENT DOCUMENTS

| | | |
|---|---|---|
| JP | 2008-288953 | 11/2008 |
| JP | 2012-034348 | 2/2012 |
| WO | 2015/111368 | 7/2015 |

* cited by examiner

IMAGING DEVICE AND CAMERA SYSTEM

BACKGROUND

1. Technical Field

The present disclosure relates to an imaging device and a camera system.

2. Description of the Related Art

Imaging devices such as complementary metal-oxide-semiconductor (CMOS) image sensors have been used in recent years (see, for example, Japanese Patent No. 5067011 and International Publication No. WO 2015/111368).

SUMMARY

A demand made on these imaging devices is to suppress an increase in an area and to achieve a speedup.

In one general aspect, the techniques disclosed here feature an imaging device that comprises: a pixel that outputs a pixel signal corresponding to incident light; a comparator that compares the pixel signal with a reference signal and generates an output signal that indicates a comparison result; a counter that generates a digital signal corresponding to the pixel signal by counting the number of periods until the output signal is inverted, the counter including first to fourth counter parts, each of which corresponds to one of a plurality of bits included in the digital signal; a memory that stores the digital signal, the memory including a first memory part corresponding to the first counter part, a second memory part corresponding to the second counter part, a third memory part corresponding to the third counter part, and a fourth memory part corresponding to the fourth counter part; a first wiring line; and a second wiring line different from the first wiring line. The first counter part is connected to the first memory part through the first wiring line. The third counter part is connected to the third memory part through the first wiring line. The second counter part is connected to the second memory part through the second wiring line. The fourth counter part is connected to the fourth memory part through the second wiring line.

General or specific aspects may be realized by means of an element, a device, a module, a system, an integrated circuit, or a method. Furthermore, general or specific aspects may be realized by means of an arbitrary combination of an element, a device, a module, a system, an integrated circuit, and a method.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
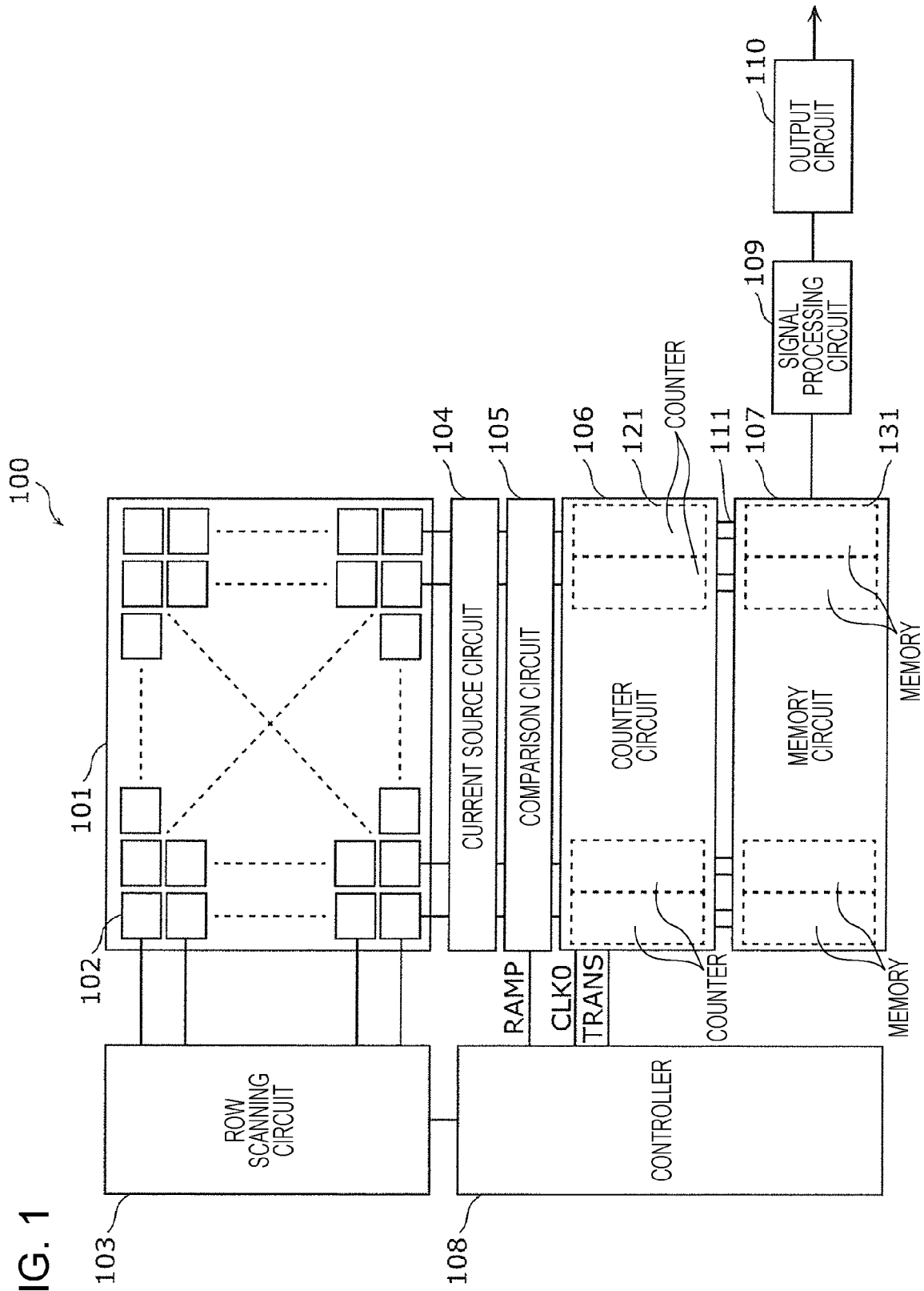
FIG. 1 is a block diagram schematically illustrating the structure of an imaging device according to a first embodiment.

Underlying Knowledge Forming Basis of the Present Disclosure

Each of column AD conversion circuits arranged in a column direction converts an analog signal output from a pixel to a digital signal. A technology that shortens the AD conversion time taken by the column AD conversion circuit is proposed. A technology that speeds up processing to transfer a digital signal to the outside of the image sensor is also proposed. Japanese Patent No. 5067011, for example, proposes a method by which transfers from counters to memories are performed at one time. Specifically, counters are connected to their corresponding memories with individual signals, so transfers from all counters to their corresponding memories can be concurrently performed. Since, in this method however, signals are transferred at one time, many signals are required at a time. Image sensors available at present have more pixels, reducing the pitch per pixel. As the frame rate becomes high, more column AD conversion circuits are used to perform parallel processing, so column AD conversion circuits are arranged at a narrow pitch. Therefore, the number of signal lines per column needs to be suppressed. In this situation, it is difficult to use a method by which a plurality of signal lines are used to transfer signals at one time, as described in Japanese Patent No. 5067011. This method is also problematic in that the peak current during transfer is increased and noise caused by the peak current is also increased.

International Publication No. WO 2015/111368 proposes a method in which a common bus is used to transfer signals between counters and memories. Specifically, a plurality of counters and a plurality of memories are mutually connected with a single signal line. In the method in International Publication No. WO 2015/111368, however, the time taken by transfer processing may be prolonged and the total processing time may thereby be prolonged.

In embodiments described below, an imaging device that can suppress an increase in an area and can achieve a speedup will be described. An imaging device that can reduce the peak current during transfer and can reduce noise caused by the peak current is also described.

A imaging device comprises: a pixel that outputs a pixel signal corresponding to incident light; a comparator that compares the pixel signal with a reference signal and generates an output signal that indicates a comparison result; a counter that generates a digital signal corresponding to the pixel signal by counting the number of periods until the output signal is inverted, the counter including first to fourth counter parts, each of which corresponds to one of a plurality of bits included in the digital signal; a memory that stores the digital signal, the memory including a first memory part corresponding to the first counter part, a second memory part corresponding to the second counter part, a third memory part corresponding to the third counter part, and a fourth memory part corresponding to the fourth counter part; a first wiring line; and a second wiring line different from the first wiring line. The first counter part is connected to the first memory part through the first wiring line. The third counter part is connected to the third memory part through the first wiring line. The second counter part is connected to the second memory part through the second wiring line. The fourth counter part is connected to the fourth memory part through the second wiring line.

According to this, since transfer processing is performed by using the first wiring line and second wiring line, the transfer processing can be performed at high speed. Since each of the first wiring line and second wiring line can also be used as a common bus through which a plurality of bits are transferred, it is possible to suppress an increase in the area of the wiring region. It is also possible to reduce the peak current during transfer and to reduce noise caused by the peak current.

For example, the imaging device may comprise L wiring lines including the first wiring line and the second wiring line, where L is an integer equal to or larger than 2. The counter may include at least 2L counter parts arranged in a first sequence. The first counter part may be located at an ith position in the first sequence, where i is an integer equal to or smaller than L. The third counter part may be located at an (i+L)th position in the first sequence. The second counter part may be located at a kth position in the first sequence, where k is an integer equal to or smaller than L and is different from i. The fourth counter part may be located at a (k+L)th position in the first sequence.

For example, the memory may include at least 2L memory parts arranged in a second sequence. The first memory part may be located at an ith position in the second sequence. The third memory part may be located at an (i+L)th position in the second sequence. The second memory part may be located in at a kth position in the second sequence. The fourth memory part may be located at a (k+L)th position in the second sequence.

For example, the first counter part and the third counter part may be located at odd-numbered positions in the first sequence. The second counter part and the fourth counter part may be located at even-numbered positions in the first sequence.

For example, the first memory part and the third memory part may be located at odd-numbered positions in the second sequence. The second memory part and the fourth memory part may be located at even-numbered positions in the second sequence.

According to this, since a signal line used to control transfer processing can be shared by adjacent counter parts and memory parts, wiring resources can be reduced. This enables the area of the wiring region to be reduced.

For example, the first counter part and the third counter part may correspond to low-order bits of the digital signal. The second counter part and the fourth counter part may correspond to high-order bits of the digital signal.

According to this, one of the high-order bit and one of the low-order bits are concurrently transferred. During imaging at low illumination, data in the high-order bits is not shifted. In this structure, therefore, it is possible to suppress the peak current in transfer processing during imaging at low illumination.

For example, transfer from the first counter part to the first memory part and transfer from the second counter part to the second memory part may be performed in response to a same signal.

According to this, data transfer through the first wiring line and data transfer through the second wiring line can be concurrently performed. Therefore, transfer processing can be performed at high speed.

For example, transfer from the first counter part to the first memory part may be performed at a first timing. Transfer from the second counter part to the second memory part may be performed at a second timing different from the first timing.

According to this, data transfer through the first wiring line and data transfer through the second wiring line are performed at mutually different timings. Thus, it is possible to suppress the peak current during transfer.

For example, the imaging device may have a first operation mode and a second operation mode. In the first operation mode, transfer from the first counter part to the first memory part and transfer from the second counter part to the second memory part may be performed in response to a same signal. In the second operation mode, transfer from the first counter part to the first memory part may be performed at a first timing. Transfer from the second counter part to the second memory part may be performed at a second timing different from the first timing.

According to this, a switchover can be made between the first operation mode, in which a speedup can be achieved, and the second operation mode, in which the peak current during transfer can be suppressed, according to the purpose. Therefore, a single counter circuit and a single memory circuit can be shared by imaging devices or camera systems used in a plurality of applications.

A camera system according to one aspect of the present disclosure has the imaging device and a camera signal processor that processes a signal output from the imaging device.

According to this, since, in the camera system, transfer processing is performed by using the first wiring line and second wiring line, the transfer processing can be performed at high speed. Since each of the first wiring line and second wiring line can also be used as a common bus through which a plurality of bits are transferred, it is possible to suppress an increase in the area of the wiring region. It is also possible to reduce the peak current during transfer and to reduce noise caused by the peak current.

Embodiments of the present disclosure will be described in detail with reference to the drawings. All embodiments described below illustrate general or specific examples. Numerals, shapes, materials, constituent elements, the placement and connection forms of these constituent elements, steps, the sequence of these steps, and the like are only examples, and are not intended to restrict the present disclosure. Various aspects described in this specification can be mutually combined unless any contradiction occurs. Of the constituent elements described in the embodiments below, constituent elements not described in independent claims, each of which indicates the topmost concept, will be described as optional constituent elements. In the description below, constituent elements having essentially the same function will be given the same reference characters and descriptions will sometimes be omitted.

First Embodiment

First, the structure of an imaging device according to this embodiment will be described. FIG. 1 is a block diagram schematically illustrating the structure of the imaging device 100 according to this embodiment. The imaging device 100 in FIG. 1 has a pixel array 101 including a plurality of pixels 102 and also has peripheral circuits.

The plurality of pixels 102, which are arrayed in, for example, a matrix on a semiconductor substrate, function as an imaging area. Each pixel 102 creates charge by photoelectric conversion of incident light and outputs a pixel signal, which is an electric signal corresponding to the charge. The plurality of pixels 102 are connected to vertical signal lines, each of which is provided for one column.

In the example illustrated in FIG. 1, the center of each pixel 102 is positioned at a lattice point of a square lattice. Of course, the placement of the plurality of pixels 102 is not limited to the illustrated example; for example, the plurality of pixels 102 may be placed so that the center of each pixel 102 is positioned at a lattice point of a triangular lattice, a hexagonal lattice, or the like. Alternatively, the plurality of pixels 102 may be arranged one dimensionally, in which case the imaging device 100 can be used as a line sensor.

In the structure illustrated in FIG. 1, the peripheral circuits include a row scanning circuit 103, a current source circuit 104, a comparison circuit 105, a counter circuit 106, a memory circuit 107, a controller 108, a signal processing circuit 109, and an output circuit 110. These peripheral circuits may be placed on the semiconductor substrate on which the pixel array 101 is formed. Alternatively, part of the peripheral circuits may be placed on another substrate.

The row scanning circuit 103 selects pixels 102 in part of the rows in the plurality of pixels 102. The current source circuit 104 includes current sources (not illustrated), each of which is provided for one column. Each current source is connected to the vertical signal line for the corresponding column.

The comparison circuit 105 includes comparators, each of which is provided for one column. Each comparator, which is connected to the corresponding vertical signal line, compares a pixel signal output from the pixel 102 to the vertical signal line with a reference signal RAMP, and creates an output signal that indicates a comparison result.

The counter circuit 106 includes counters 121, each of which is provided for one column. Each counter 121 creates a digital signal corresponding to a pixel signal by counting the number of periods from when a period eligible for counting starts until an output signal from the comparator is inverted to. That is, when a pixel signal, which is an analog signal, is converted from analog to digital by the comparator and counter 121, a digital signal is created.

The memory circuit 107 includes memories 131, each of which is provided for one column. Each memory 131 stores a digital signal obtained from the corresponding counter 121.

A common transfer bus 111, which is connected between each counter 121 and its corresponding memory 131, transfers a digital signal output from the counter 121 to its corresponding memory 131.

The controller 108 controls each processor. The signal processing circuit 109 performs signal processing on the digital signal stored in the memory circuit 107. The output circuit 110 outputs a digital signal that has been processed in the signal processing circuit 109 to the outside of the imaging device 100.

Figure 2:
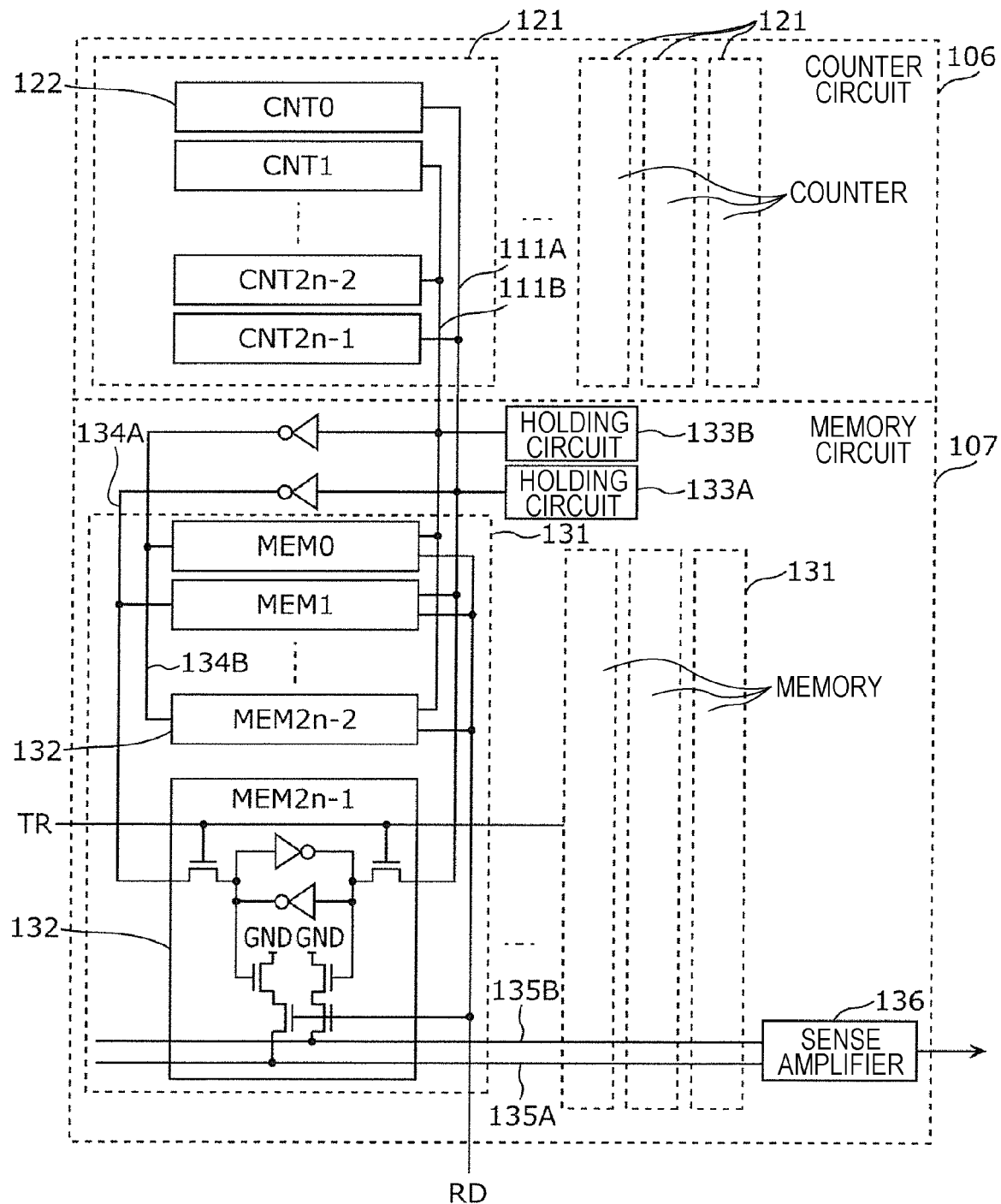
FIG. 2 illustrates the structures of a counter circuit and memory circuit according to the first embodiment.

FIG. 2 illustrates the structures of the counter circuit 106 and memory circuit 107. The counter 121, which is a 2n-bit counter (n is an integer equal to or larger than 1), includes 2n counter parts 122. Each counter part 122 is a one-bit counter. That is, the counter 121 creates a 2n-bit digital signal. Each of the 2n counter parts 122 corresponds to one bit included in the digital signal. The 2n counter parts 122 are arrayed in, for example, the direction in which the column extends. For example, the counter part ONT0 illustrated in FIG. 2 corresponds to the least significant bit of the digital signal and the counter part CNT2n-1 corresponds to the most significant bit of the digital signal. That is, the counter parts CNT0 to CNT2n-1 sequentially correspond to bits 0 to 2n-1 in the digital signal.

The memory 131, which is a 2n-bit memory (n is an integer equal to or larger than 1), includes 2n memory parts 132. That is, the memory 131 stores a 2n-bit digital signal. Each memory part 132 is a one-bit memory. That is, each of the 2n memory parts 132 corresponds to one bit included in the digital signal. The 2n memory parts 132 are arrayed in, for example, the direction in which the column extends. For example, the memory part MEM0 illustrated in FIG. 2 corresponds to the least significant bit of the digital signal and the memory part MEM2n-1 corresponds to the most significant bit of the digital signal. That is, the memory parts MEM0 to MEM2n-1 sequentially correspond to bits 0 to 2n-1 in the digital signal. The 2n counter parts 122 and 2n memory parts 132 are mutually connected through common transfer buses 111A, 111B, 134A, and 134B.

The memory circuit 107 also includes holding circuits 133A and 133B and a sense amplifier 136. The holding circuit 133A is connected to the common transfer bus 111A, and the holding circuit 133B is connected to the common transfer bus 111B.

When data held in the memory part 132 is to be read out, the data in the memory part 132 is selected through a read-out word line RD and is output to read-out bit lines 135A and 135B. The sense amplifier 136 amplifies the data and outputs the amplified data.

Figure 3:
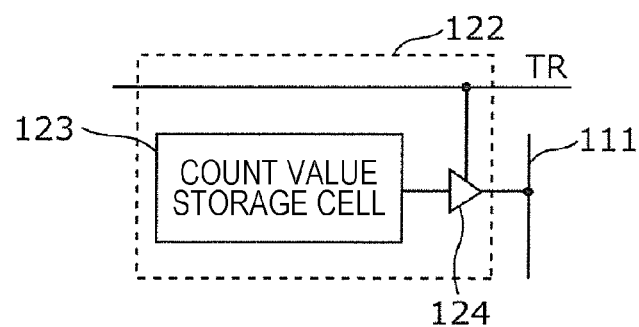
FIG. 3 illustrates the structure of a counting part according to the first embodiment.

FIG. 3 illustrates the structure of the counter part 122. The counter part 122 includes a count value storage cell 123, which holds a one-bit count value, and a tri-state buffer 124. The output terminal of the tri-state buffer 124 is connected to only one of the common transfer buses 111A and 111B. In the description below, when the common transfer buses 111A and 111B are not distinguished from each other, any one of the common transfer buses 111A and 111B may also be referred to as the common transfer bus 111. Similarly, when the common transfer buses 134A and 134B are not distinguished from each other, any one of the common transfer buses 134A and 134B may also be referred to as the common transfer bus 134. Data in the count value storage cell 123 is output to the common transfer bus 111 in response to a transfer signal TR. Inverted data of the data is output to the common transfer bus 134.

Figure 4:
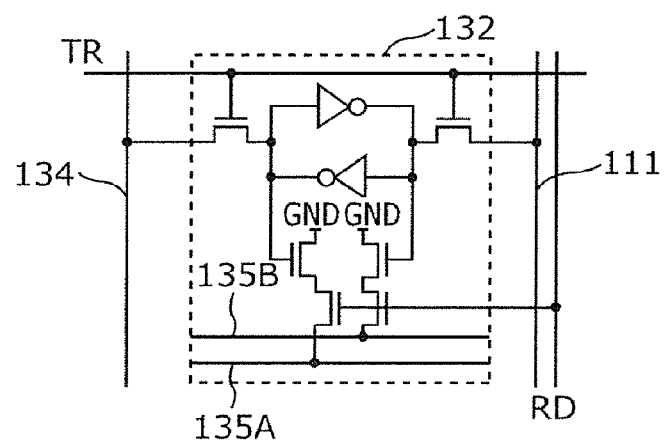
FIG. 4 is a circuit diagram illustrating the structure of a memory part according to the first embodiment.

FIG. 4 illustrates the structure of the memory part 132. When a transfer signal TR in a transfer word line goes high, data in the common transfer bus 111 is written to the memory part 132. When the read-out word line RD goes high, data in the memory part 132 is output to the read-out bit lines 135A and 135B. Thus, an operation to read out from the memory part 132 is executed. Although, in the example in FIG. 4, the memory part 132 is a static random-access memory (SRAM), the structure of the memory part 132 is not limited to this example.

Figure 5:
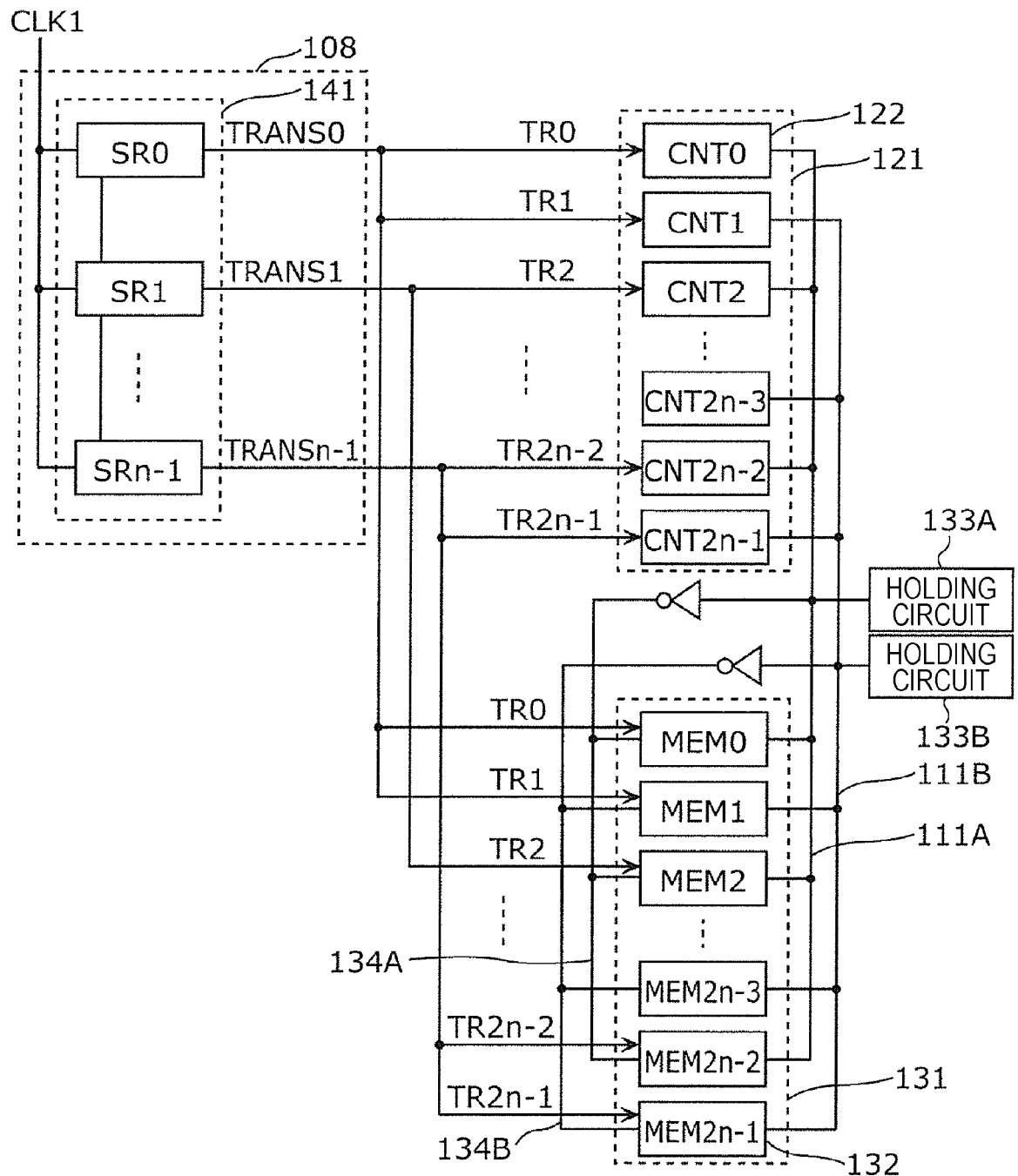
FIG. 5 illustrates the structures of a controller, a counter, and a memory according to the first embodiment.

FIG. 5 illustrates connections among one counter 121, one memory 131, and the controller 108.

As illustrated in FIG. 5, the counter part 122 at bit 0, which is the least significant bit, is connected to the common transfer bus 111A, the counter part 122 at bit 1 is connected to the common transfer bus 111B, the counter part 122 at bit 2 is connected to the common transfer bus 111A, the counter part 122 at bit 2n-2 is connected to the common transfer bus 111A, and the counter part 122 at bit 2n-1 is connected to the common transfer bus 111B. Counter parts 122 connected to the common transfer bus 111A and counter parts 122 connected to the common transfer bus 111B are alternately connected in this way. That is, the plurality of counter parts 122 are placed sequentially in the direction in which the column extends. Each of the plurality of counter parts 122 connected to the common transfer bus 111A is placed at an odd-numbered position in the above sequence. Each of the plurality of counter parts 122 connected to the common transfer bus 111B is placed at an even-numbered position in the above sequence.

In other words, a plurality of counter parts 122 corresponding to even-numbered bits are connected to the common transfer bus 111A, and a plurality of counter parts 122 corresponding to odd-numbered bits are connected to the common transfer bus 111B.

The memory part 132 at bit 0 is connected to the common transfer buses 111A and 134A, the memory part 132 at bit 1 is connected to the common transfer buses 111B and 134B, the memory part 132 at bit 2 is connected to the common transfer buses 111A and 134A, the memory part 132 at bit 2n-2 is connected to the common transfer buses 111A and 134A, and the memory part 132 at bit 2n-1 is connected to the common transfer buses 111B and 134B.

The plurality of memory parts 132 are arranged in a second sequence. Memory parts 132 connected to the common transfer buses 111A and 134A and memory parts 132 connected to the common transfer buses 111B and 134B are alternately connected in this way. That is, the plurality of memory parts 132 are placed sequentially in the direction in which the column extends. Each of the plurality of memory parts 132 connected to the common transfer buses 111A and 134A is placed at an odd-numbered position in the above sequence. Each of the plurality of memory parts 132 connected to the common transfer bus 111B and 134B is placed at an even-numbered position in the above sequence.

In other words, a plurality of memory parts 132 corresponding to even-numbered bits are connected to the common transfer buses 111A and 134A, and a plurality of memory parts 132 corresponding to odd-numbered bits are connected to the common transfer buses 111B and 134B.

The controller 108 includes an n-bit shift register 141. The shift register 141 uses a transfer clock signal CLK1 to create n-bit transfer signals TRANS0 to TRANSn-1. The transfer signal TRANS0 is supplied to the counter parts 122 and memory parts 132 at bits 0 and 1. Similarly, the transfer signals TRANS at the remaining bits are supplied to the counter parts 122 and memory parts 132 at two relevant consecutive bits. In the description below, the transfer signal supplied to the counter part 122 and memory part 132 at a certain bit will be referred to as TRi (i is any of 1 to 2n-1).

In this structure, the same signal is supplied to the counter parts 122 at two adjacent bits, so lines corresponding to two bits can be implemented with a single line. Therefore, the area of the wiring region can be reduced. Although an example has been described in which a plurality of counter parts 122 and a plurality of memory parts 132 are arranged in a bit sequence, they may not be arranged in a bit sequence. It is only necessary that the same signal is supplied to two counter parts 122 that are physically adjacent.

Figure 6:
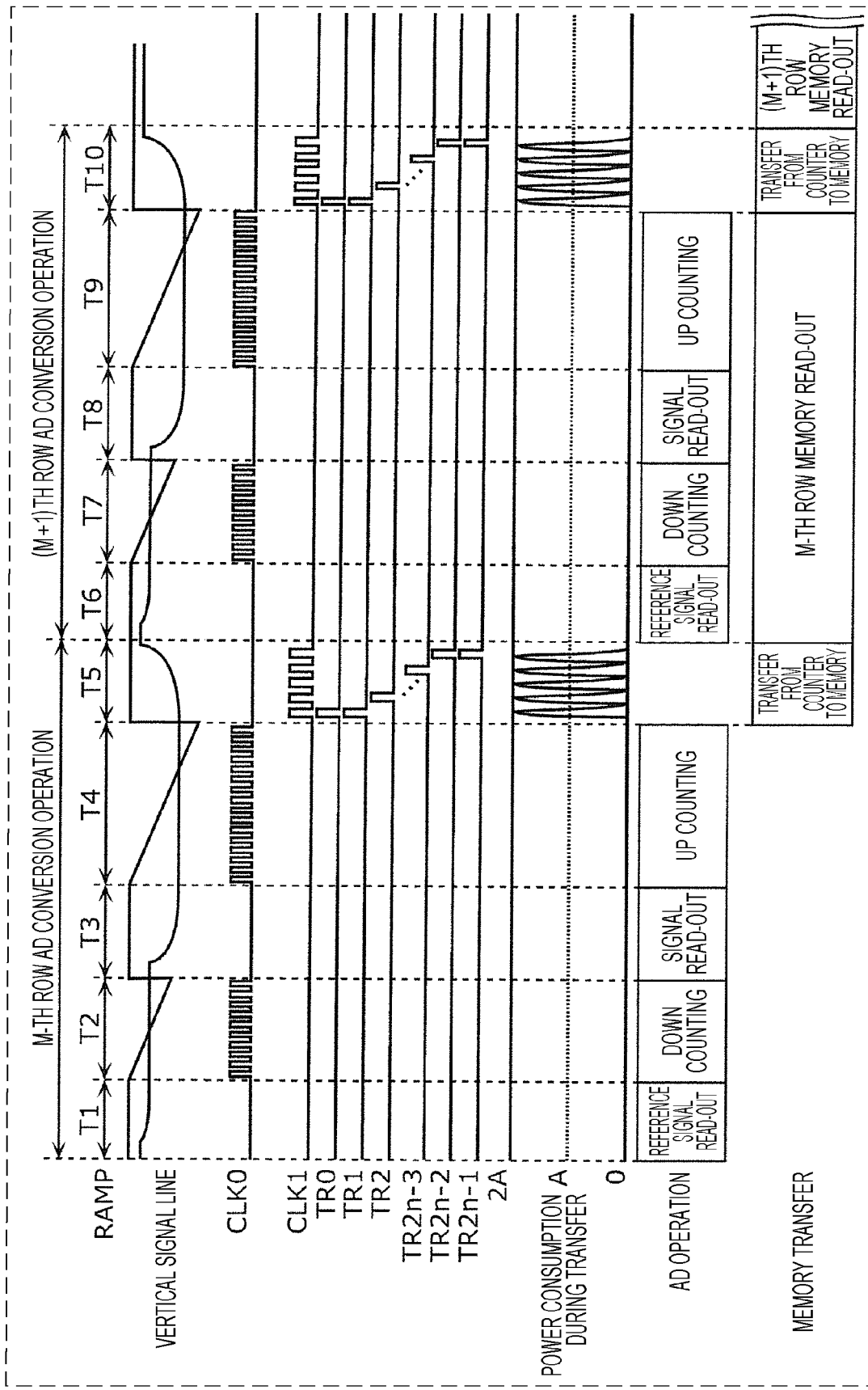
FIG. 6 is an operation timing diagram according to the first embodiment.

Next, the operation of the imaging device 100 will be described. FIG. 6 is an exemplary timing diagram that illustrates the operation of the imaging device 100 when a signal is read out.

In a period T1, a standard signal, which is a signal in a reset state, for example, is read out from the pixel 102 in an Mth row. Next, in a period T2, the reference signal RAMP is input to the comparison circuit 105 under control of the controller 108. At that time, a count clock CLK0 is input to the counter circuit 106. The counter circuit 106 counts down. Thus, the standard signal, which is an analog signal output from the pixel 102, is converted to a digital signal.

In a period T3, a signal is read out from the pixel 102 according to the intensity of light. In a period T4, the reference signal RAMP is input to the comparison circuit 105 under control of the controller 108. At that time, the count clock CLK0 is input to the counter circuit 106. The counter circuit 106 counts up. Thus, a digital signal equivalent to the difference between the standard signal and the signal obtained from the pixel 102 in the Mth row according to the intensity of light is stored in the counter circuit 106.

In a period T5, the controller 108 uses the transfer clock signal CLK1 to create the transfer signals TRANS0 to TRANSn-1 and supplies them to the counter circuit 106 as transfer signals TR0 to TR2n-1. Thus, the digital signal in the counter circuit 106 is transferred to the memory circuit 107.

Specifically, the transfer signal TRANS0 at bit 0 is activated in response to the first transfer signal CLK1. This transfer signal TRANS0 is supplied to the counter parts 122 and memory parts 132 at bits 0 and 1. Accordingly, data and inverted data in the counter part 122 at bit 0 are respectively output to the common transfer buses 111A and 134A, and are stored in the memory part 132 at bit 0. Similarly, data and inverted data in the counter part 122 at bit 1 are respectively output to the common transfer buses 111B and 134B, and are stored in the memory part 132 at bit 1. Thus, transfer from the counter part 122 at bit 0 to the relevant memory part 132 and transfer from the counter part 122 at bit 1 to the relevant memory part 132 are performed at a timing based on the same transfer signal TRANS0.

Subsequently, similar operation is sequentially performed. Thus, a 2n-bit digital signal is transferred at high speed from the counter parts 122 at 2n bits to the memory parts 132 at 2n bits in response to n transfer clocks.

Next, a pixel signal in the (M+1)th row is similarly read out in periods T6 to T10. At that time, a digital signal is read out from the memory circuit 107 according to the pixel signal in the Mth row and is output to the outside of the imaging device 100.

The number of bits of the counter parts 122 may not be even and the number of bits of the memory parts 132 may not be even. There may be a mismatch between the number of bits of the counter parts 122 and the number of bits of the memory parts 132. For example, the counter parts 122 may constitute 11 bits and the memory parts 132 may constitute 12 bits. In this case, a flag signal or the like that is not included in data of the counter parts 122 is stored in one extra bit of the memory parts 132.

The number of common transfer buses 111 may be 3 or larger. If, for example, L common transfer buses 111 from a first common transfer bus 111 to an Lth common transfer bus 111 (L is an integer equal to or larger 2), are used, the counter parts 122 placed at ith and (i+L)th positions and the memory parts 132 placed at ith and (i+L)th positions are connected to an ith common transfer bus 111 (i is any integer from 1 to L).

Second Embodiment

Figure 7:
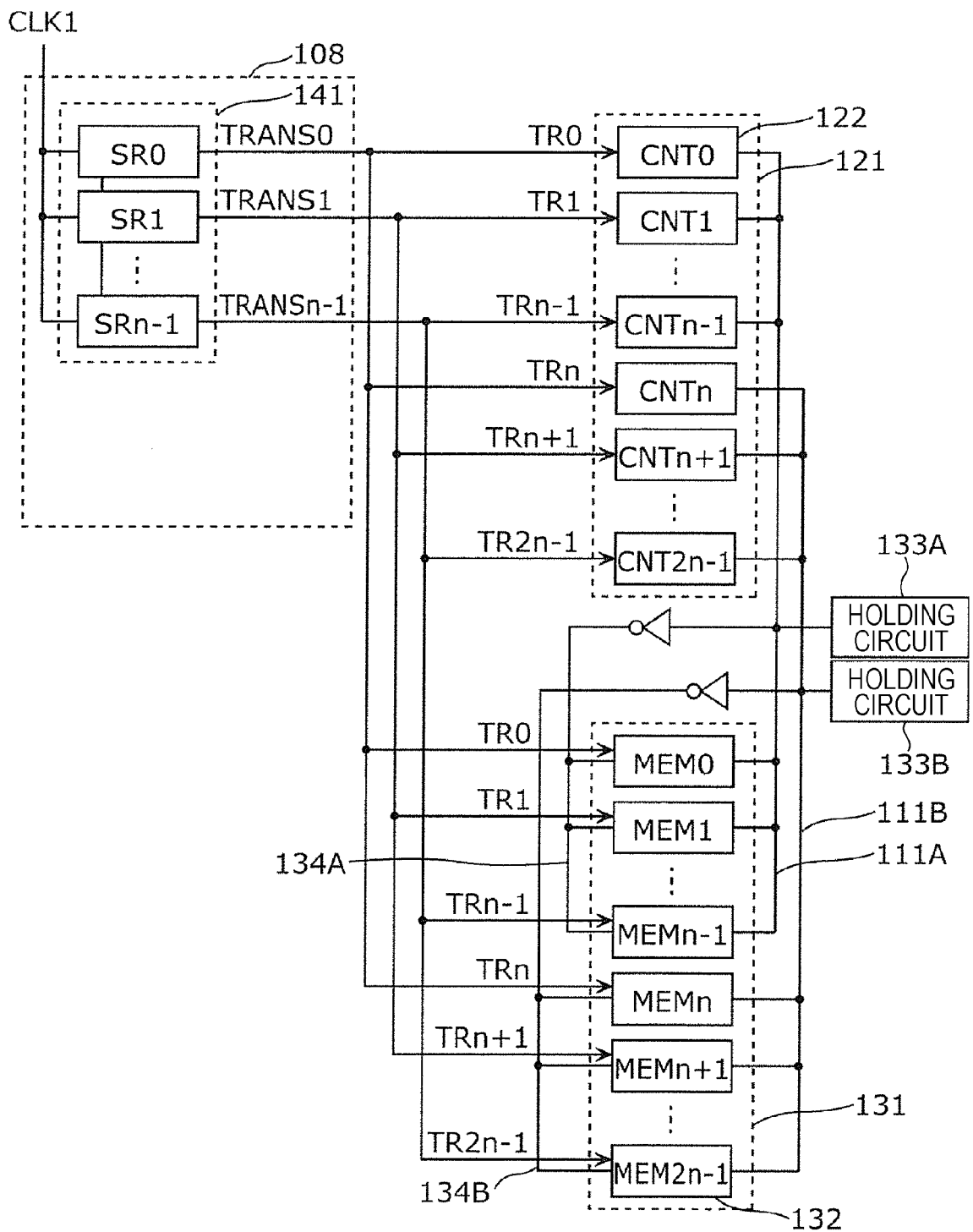
FIG. 7 illustrates the structures of a controller, counter, and memory according to a second embodiment.

A variation of the first embodiment will be described in this embodiment. This embodiment differs from the first embodiment in connections between the counter parts 122 and the two common transfer buses 111A and 111B and between the memory parts 132 and the two common transfer buses 111A and 111B. FIG. 7 illustrates connections among one counter 121, one memory 131, and the controller 108 in the imaging device 100 in this embodiment.

As illustrated in FIG. 7, the counter parts 122 at bit 0, which is the least significant bit, to bit n-1 are connected to the common transfer bus 111A, and the counter parts 122 at bits n to 2n-1 are connected to the common transfer bus 111B.

The memory parts 132 at bit 0, which is the least significant bit, to bit n-1 are connected to the common transfer buses 111A and 134A, and the memory parts 132 at bits n to 2n-1 are connected to the common transfer buses 111B and 134B.

As described above, a plurality of counter parts 122 and a plurality of memory parts 132 connected to the common transfer bus 111A correspond to a plurality of low-order bits of a digital signal. A plurality of counter parts 122 and a plurality of memory parts 132 connected to the common transfer bus 111B correspond to a plurality of high-order bits of the digital signal.

The structure of the controller 108 is the same as in the first embodiment, except that the transfer signals TRANS0 to TRANSn-1 are supplied to different destinations from those in the first embodiment. The transfer signal TRANS0 is supplied to the counter parts 122 and memory parts 132 at bits 0 and n. The transfer signals TRANS for each subsequent bit is similarly supplied sequentially to two counter parts 122 separated n bits and to two memory parts 132 separated n bits.

Figure 8:
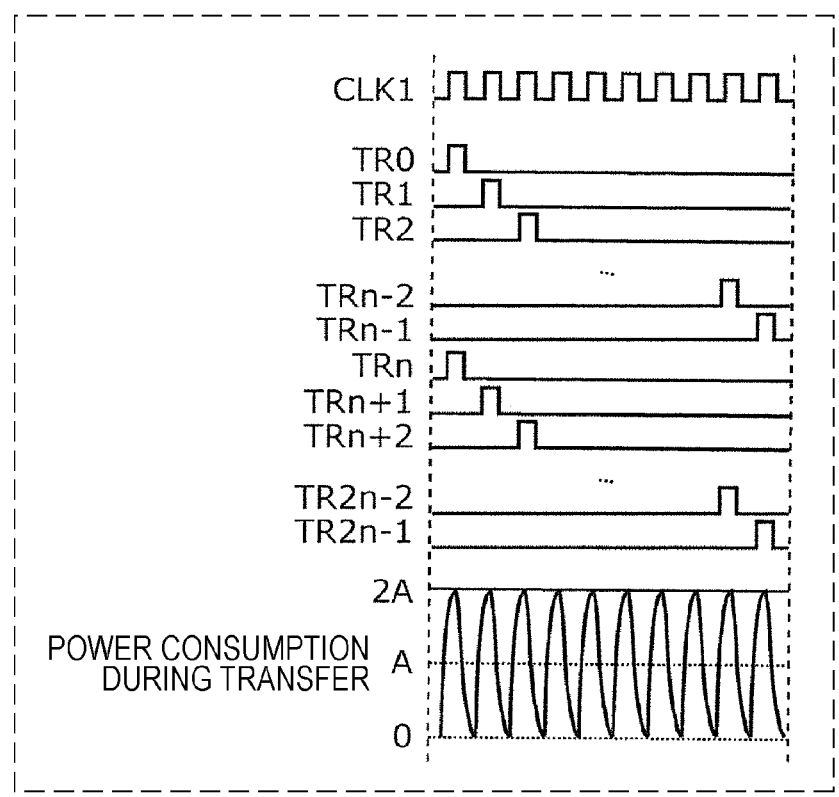
FIG. 8 illustrates an operation timing diagram and power consumption according to the second embodiment.

FIG. 8 is an operation timing diagram of a transfer operation from the counter part 122 to the memory part 132 during imaging at normal illumination. The controller 108 uses the transfer clock signal CLK1 to create the transfer signals TRANS0 to TRANSn-1 and supplies them to the counter circuit 106 as the transfer signals TR0 to TR2n-1. Thus, the digital signal in the counter circuit 106 is transferred to the memory circuit 107.

Specifically, the transfer signal TRANS0 at bit 0 is activated in response to the first transfer signal CLK1. This transfer signal TRANS0 is supplied to the counter parts 122 and memory parts 132 at bits 0 and n. Accordingly, data and inverted data in the counter part 122 at bit 0 are respectively output to the common transfer buses 111A and 134A, and are stored in the memory part 132 at bit 0. Similarly, data and inverted data in the counter part 122 at bit n are respectively output to the common transfer buses 111B and 134B, and are stored in the memory part 132 at bit n.

Subsequently, similar operation is sequentially performed. Thus, a 2n-bit digital signal is transferred at high speed in response to n transfer clocks, as in the first embodiment.

Here, it will be assumed that a peak current when data is inverted during one-bit transfer is A. Since two-bit data is transferred at a time, a peak current of up to 2A may be consumed for each clock.

Figure 9:
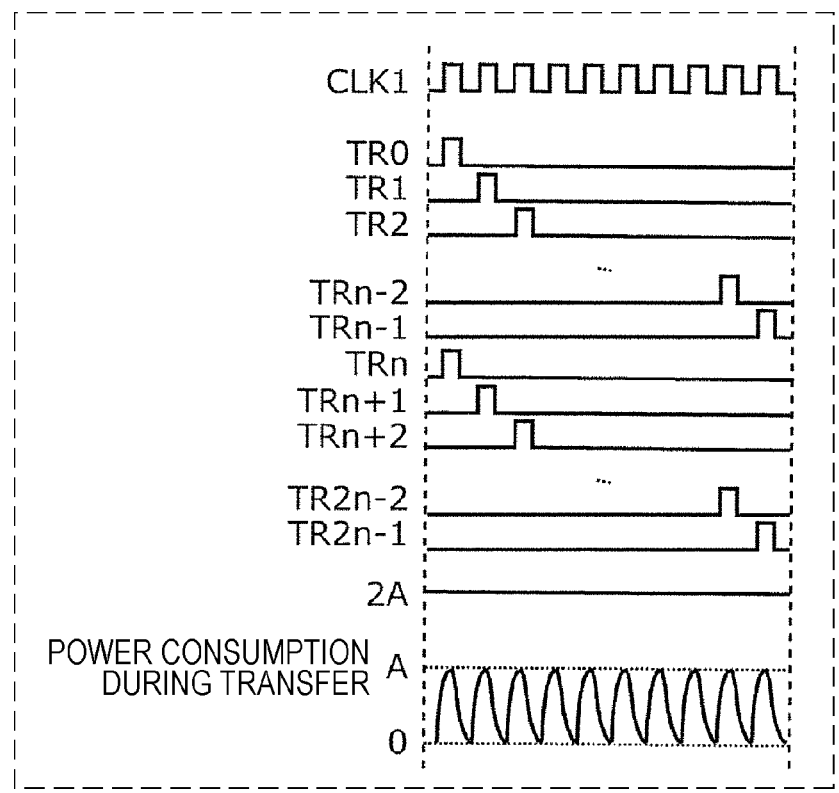
FIG. 9 illustrates an operation timing diagram and power consumption during imaging at low illumination according to the second embodiment.

FIG. 9 is an operation timing diagram of a transfer operation from the counter part 122 to the memory part 132 during imaging at low illumination. During imaging at low illumination, the high-order bits virtually remain unchanged, so the common transfer bus 111B on the high-order side does not virtually change from data held in the holding circuit 133B. Therefore, almost no current to drive the common transfer buses 111B and 134B is generated during transfer from the counter part 122 to the memory part 132. In this embodiment, bit groups that are concurrently transferred are high-order bits and low-order bits as described above. Therefore, the peak current during imaging at low illumination is A as illustrated in FIG. 9. Thus, when the structure in this embodiment is used, the peak current during imaging at low illumination can be reduced. This enables noise caused by the peak current to be reduced.

To reduce the peak current during imaging at low illumination, it suffices to perform control so that digital signals to be concurrently transferred are grouped into high-order bits and low-order bits. That is, a plurality of counter parts 122 and a plurality of memory parts 132 may be placed in any physical placement.

Third Embodiment

Another variation of the first embodiment will be described in this embodiment. In the first embodiment, an example has been described in which two-bit data items are concurrently transferred through two common transfer buses 111A and 111B. In this embodiment, however, the two common transfer buses 111A and 111B are used to transfer data one bit at a time at a different timing.

Figure 10:
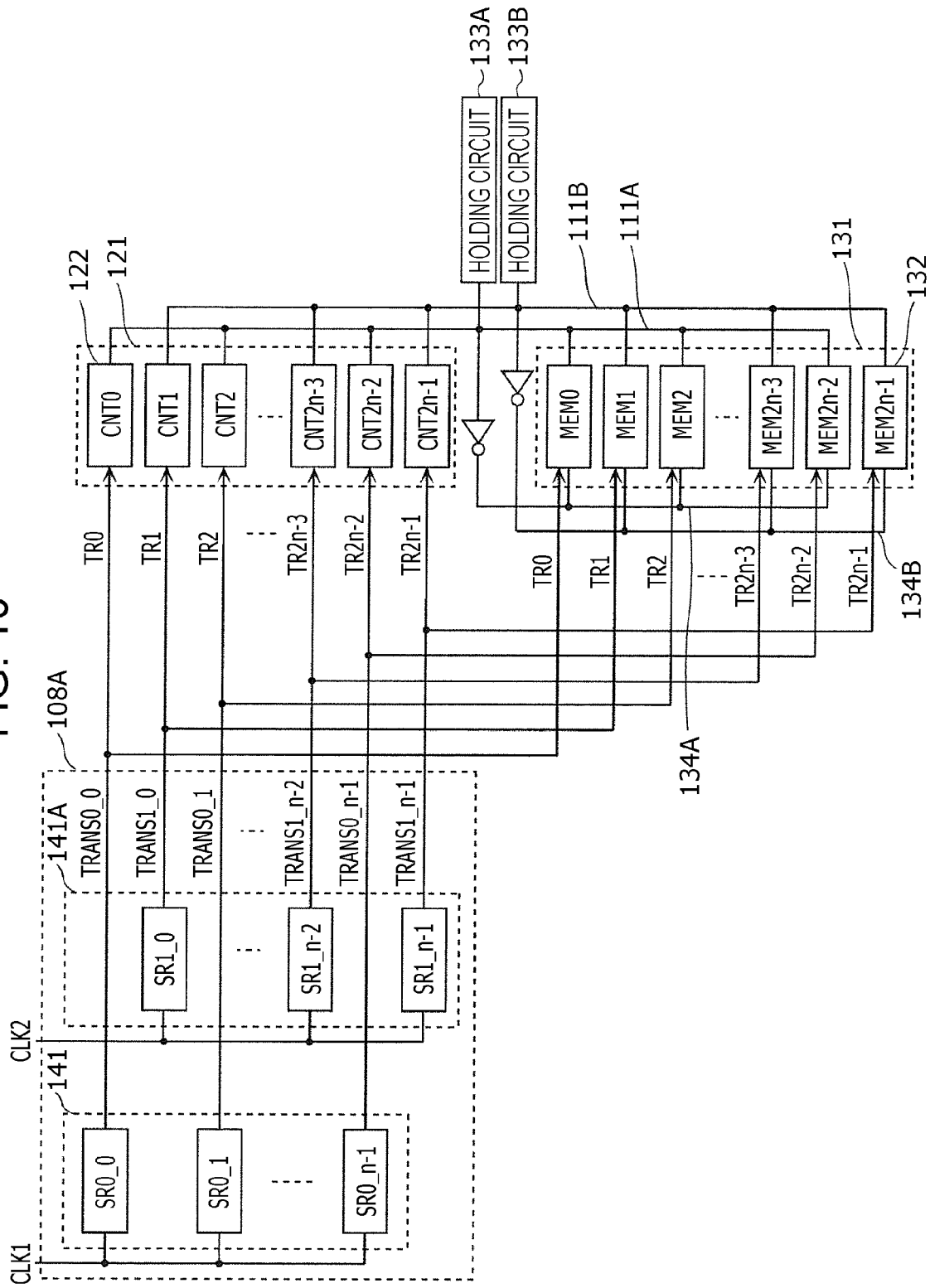
FIG. 10 illustrates the structures of a controller, counter, and memory according to a third embodiment.

FIG. 10 illustrates connections among one counter 121, one memory 131, and a controller 108A in the imaging device 100 in this embodiment.

Connections of the counter parts 122 and memory parts 132 to the common transfer buses 111A and 111B are the same as in the first embodiment.

The controller 108A has the n-bit shift register 141 and an n-bit shift register 141A. The shift register 141 uses the transfer clock signal CLK1 to create n-bit transfer signals TRANS0_0 to TRANS0_n-1. The transfer signals TRANS0_0 to TRANS0_n-1 are supplied to the counter parts 122 and memory parts 132 at even-numbered bits.

The shift register 141A uses a transfer clock signal CLK2 to create n-bit transfer signals TRANS1_0 to TRANS1_n-1. The transfer signals TRANS1_0 to TRANS1_n-1 are supplied to the counter parts 122 and memory parts 132 at odd-numbered bits.

Figure 11:
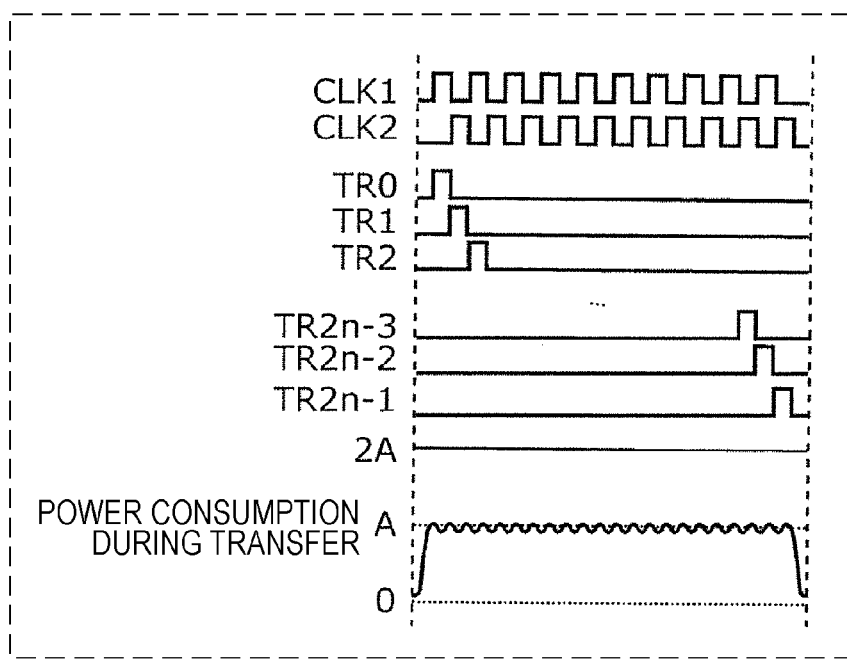
FIG. 11 illustrates an operation timing diagram and power consumption according to the third embodiment.

FIG. 11 is an operation timing diagram of a transfer operation from the counter part 122 to the memory part 132 in this embodiment. The transfer clock signals CLK1 and CLK2 have different phases; for example, the transfer clock signal CLK2 is an inverted signal of the transfer clock signal CLK1, as illustrated in FIG. 11.

As illustrated in FIG. 11, data items are sequentially transferred at different timings, starting from the counter part 122 at bit 0. That is, transfer from the counter part 122 at bit 0 to the relevant memory part 132 and transfer from the counter part 122 at bit 1 to the relevant memory part 132 are performed at different timings based on the different transfer signals TRANS0_0 and TRANS1_0.

As described above, in this embodiment, high-speed transfer can be achieved as in the first embodiment. Furthermore, since the timings of the transfer signals TR0 to TR2n-1 can be shifted, it is possible to suppress the peak current during transfer to less than 2A, as illustrated in FIG. 11. Thus, noise caused by the peak current can be reduced.

Although, in this embodiment, an example has been described in which the above variation is applied to the structure in the first embodiment, a similar variation may be applied to the structure in the second embodiment.

Periods during which a plurality of transfer signals TR are at the high level may not overlap. Part of transfer signals TR supplied to counter parts 122 connected to different common transfer buses 111 may overlap. Fourth embodiment Another variation of the first embodiment will be described in this embodiment. In this embodiment, the imaging device 100 having a first operation mode and a second operation mode will be described; in the first embodiment, high-speed transfer is carried out by using the two common transfer buses 111A and 111B described in the first embodiment; in the second embodiment, high-speed transfer is not carried out.

Figure 12:
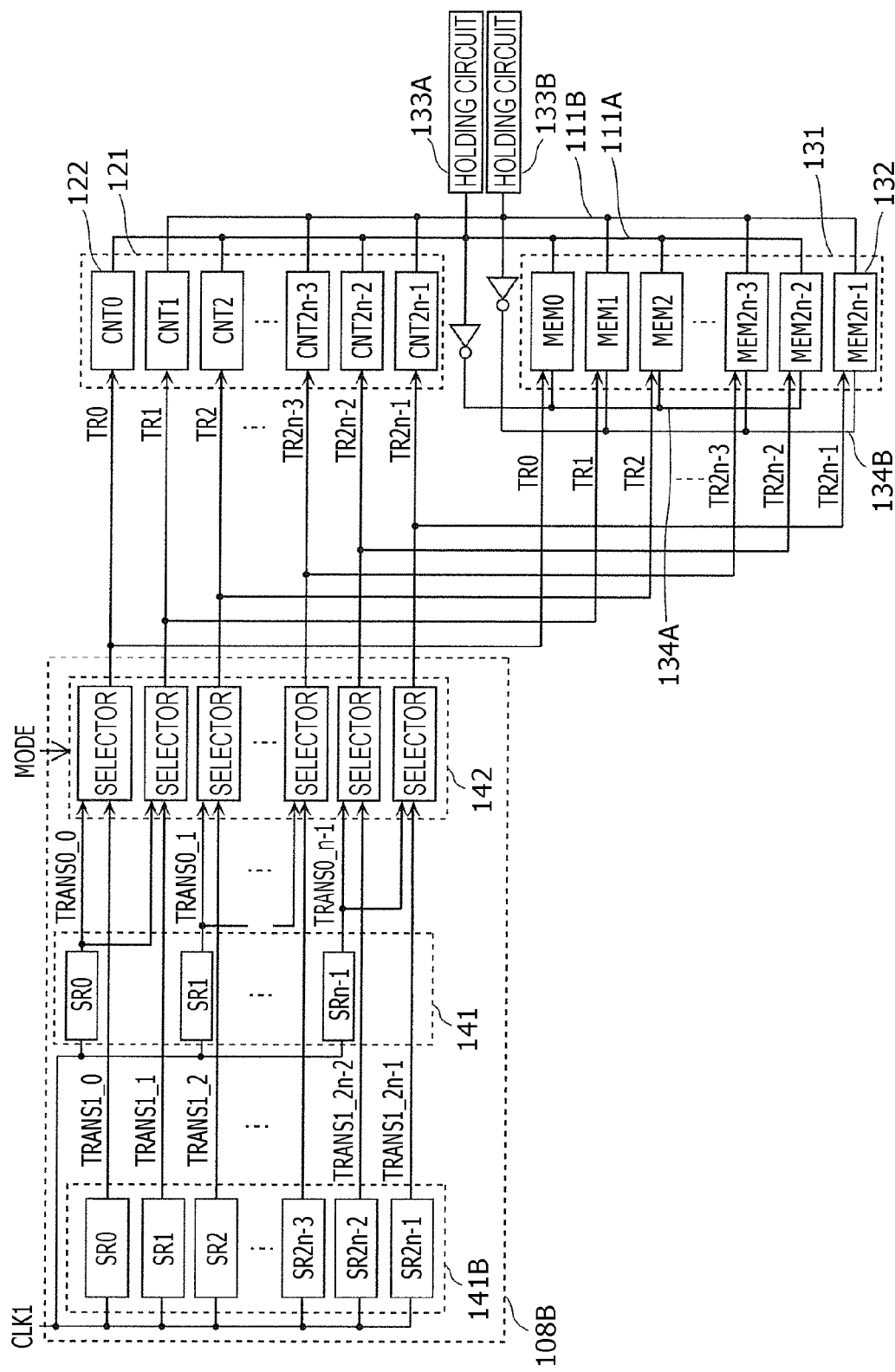
FIG. 12 illustrates the structures of a controller, counter, and memory according to a fourth embodiment.

FIG. 12 illustrates connections among one counter 121, one memory 131, and a controller 108B in the imaging device 100 in this embodiment.

Connections of the counter parts 122 and memory parts 132 to the common transfer buses 111A and 111B are the same as in the first embodiment.

The controller 108B includes the n-bit shift register 141, a 2n-bit shift register 141B, and a selector 142. The shift register 141 uses the transfer clock signal CLK1 to create n-bit transfer signals TRANS0_0 to TRANS0_n-1. The shift register 141B uses the transfer clock signal CLK1 to create 2n-bit transfer signals TRANS1_0 to TRANS1_2n-1.

The selector 142 selects either the n-bit transfer signals TRANS0_0 to TRANS0_n-1 or the 2n-bit transfer signals TRANS1_0 to TRANS1_2n-1, according to a mode control signal MODE. The selector 142 then supplies the selected signals to a plurality of counter parts 122 and a plurality of memory parts 132 as transfer signals TR0 to TR2n-1.

Specifically, if the first operation mode is indicated by the mode control signal MODE, the selector 142 supplies the n-bit transfer signals TRANS0_0 to TRANS0_n-1 to to a plurality of counter parts 122 and a plurality of memory parts 132 by a method similar to the method in the first embodiment. If the second operation mode is indicated by the mode control signal MODE, the selector 142 supplies the 2n-bit transfer signals TRANS1_0 to TRANS1_2n-1 to a plurality of counter parts 122 and a plurality of memory parts 132.

Figure 13:
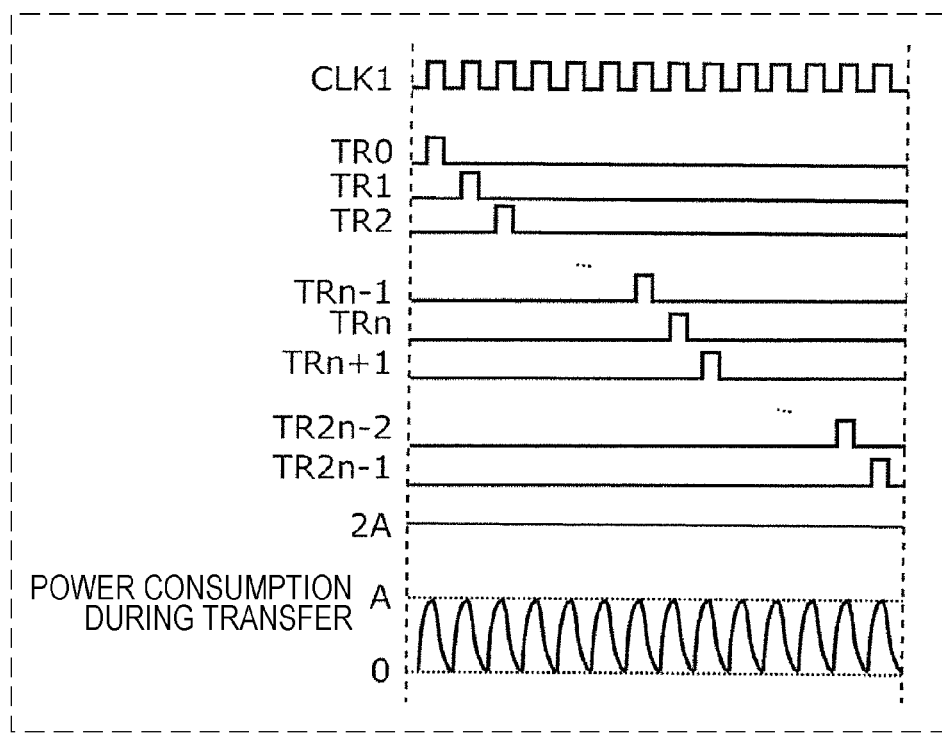
FIG. 13 illustrates an operation timing diagram and power consumption according to the fourth embodiment.

FIG. 13 is an operation timing diagram of a transfer operation when the second operation mode is selected. As illustrated in FIG. 13, in the second operation mode, only a one-bit signal is transferred in response to one clock, which is the transfer clock signal CLK1. This can reduce the peak current during transfer.

As described above, in this embodiment, a switchover can be made between the first operation mode in which high-speed transfer can be achieved and the second operation mode in which the peak current can be suppressed. Thus, a single counter circuit and a single memory circuit can be shared by imaging devices or camera systems used in a plurality of applications.

Although, in this embodiment, an example has been described in which the above variation is applied to the structure in the first embodiment, a similar variation may be applied to the structure in the second or third embodiment.

The structures described in the first to fourth embodiments are useful particularly for an imaging device in which the number of bits in the counter 121 at the transfer source is almost the same as the number of bits in the memory part 132 at the transfer destination.

Fifth Embodiment

In this embodiment, a camera system having the imaging device 100 described above will be described.

Figure 14:
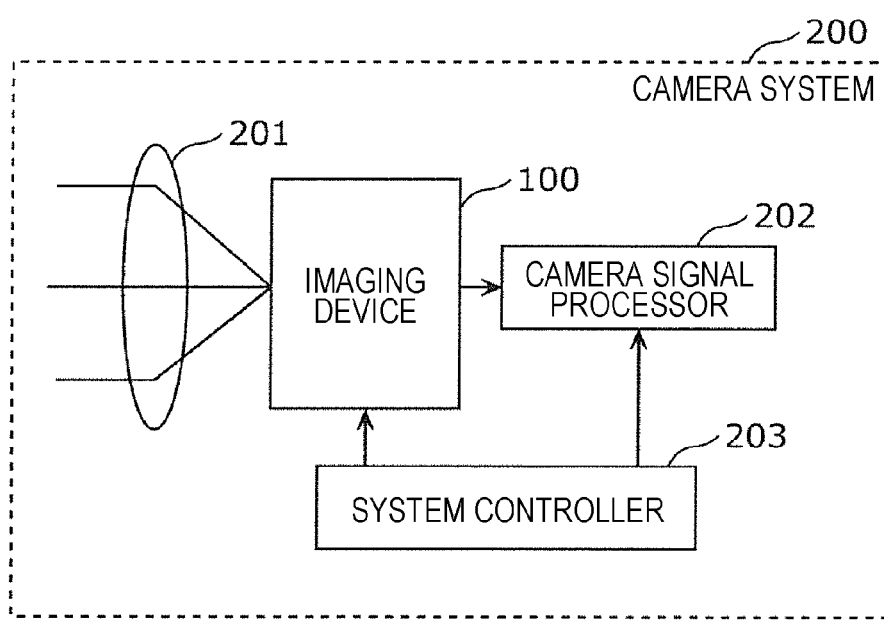
FIG. 14 illustrates an example of the structure of a camera system according to a fifth embodiment.

FIG. 14 is a block diagram illustrating an example of the structure of the camera system 200 according to this embodiment. This camera system 200 is used in a camera in, for example, a smartphone, a video camera, a digital still camera, a monitoring camera, or vehicle-mounted camera.

This camera system 200 has the imaging device 100, a lens 201, a camera signal processor 202, and a system controller 203.

The lens 201 is an optical element that leads incident light to the pixel array 101 in the imaging device 100.

The imaging device 100 is, for example, the imaging device 100 according to the embodiments described above. The imaging device 100 coverts image light focused on an imaging surface by the lens 201 to an electric signal on a per-pixel basis, after which the imaging device 100 outputs the obtained image signal.

The camera signal processor 202 is a circuit that performs various types of processing on the image signal created by the imaging device 100.

The system controller 203 is a controller that drives the imaging device 100 and camera signal processor 202.

The image signal processed by the camera signal processor 202 is recorded in a recording medium such as, for example, a memory as a still picture or moving picture. Alternatively, the image signal is displayed on a monitor comprising a liquid crystal display and the like as a moving picture.

Since the camera system 200 according to this embodiment uses the imaging device 100 described above, the camera system 200 can perform high-speed transfer from the counter circuit 106 to the memory circuit 107.

So far, the imaging device according to the embodiments of the present disclosure has been described. However, the present disclosure is not limited to these embodiments.

For example, division of the functional blocks in each block diagram is just an example. A plurality of functional blocks may be combined into one function block, a single functional block may be divided into a plurality of functional blocks, or some functions in a functional block may be transferred to another functional block.

Each processor included in each device according to the embodiments described above is typically implemented as a large-scale integrated (LSI) circuit, which is a type of integrated circuit. Each processor may be individually implemented as a single chip or a single chip may be formed so as to include part or all of processors.

Implementation of an integrated circuit is not limited to LSI circuits and may be realized by using a special circuit or a general-purpose processor. In addition, a field programmable gate array (FPGA) that can be programmed after the manufacture of the LSI circuit or a reconfigurable processor in which the connections and the settings of circuit cells disposed inside the LSI circuit can be reconfigured may be used.

In each embodiment described above, part of each constituent element may be implemented by executing a software program suitable to the constituent element. A central processing unit (CPU), a processor, or another program executor may read out a software program recorded in a recording medium such as a hard disk or a semiconductor memory and may execute the software program to implement the constituent element.

The imaging device according to the present disclosure can be applied to a digital still camera, a medical camera, a monitoring camera, a vehicle-mounted camera, a digital single-lens reflex camera, a digital mirror-less single-lens reflex camera, and other various types of camera systems and sensor systems.

What is claimed is:

1. An imaging device comprising:
a pixel that outputs a pixel signal corresponding to incident light;
a comparator that compares the pixel signal with a reference signal and generates an output signal that indicates a comparison result;
a counter that generates a digital signal corresponding to the pixel signal by counting the number of periods until the output signal is inverted, the counter including first to fourth counter parts, each of which corresponds to one of a plurality of bits included in the digital signal;
a memory that stores the digital signal, the memory including a first memory part corresponding to the first counter part, a second memory part corresponding to the second counter part, a third memory part corresponding to the third counter part, and a fourth memory part corresponding to the fourth counter part;
a first wiring line; and
a second wiring line different from the first wiring line, wherein:
the first counter part is connected to the first memory part through the first wiring line;
the third counter part is connected to the third memory part through the first wiring line;
the second counter part is connected to the second memory part through the second wiring line; and
the fourth counter part is connected to the fourth memory part through the second wiring line.

2. The imaging device according to claim 1, comprising L wiring lines including the first wiring line and the second wiring line, where L is an integer equal to or larger than 2, wherein:
the counter includes at least 2L counter parts arranged in a first sequence;
the first counter part is located at an ith position in the first sequence, where i is an integer equal to or smaller than L;
the third counter part is located at an (i+L)th position in the first sequence;
the second counter part is located at a kth position in the first sequence, where k is an integer equal to or smaller than L and is different from i; and
the fourth counter part is located at a (k+L)th position in the first sequence.

3. The imaging device according to claim 2, wherein:
the memory includes at least 2L memory parts arranged in a second sequence;
the first memory part is located at an ith position in the second sequence;
the third memory part is located at an (i+L)th position in the second sequence;
the second memory part is located in at a kth position in the second sequence; and
the fourth memory part is located at a (k+L)th position in the second sequence.

4. The imaging device according to claim 2, wherein:
the first counter part and the third counter part are located at odd-numbered positions in the first sequence; and
the second counter part and the fourth counter part are located at even-numbered positions in the first sequence.

5. The imaging device according to claim 3, wherein:
the first memory part and the third memory part are located at odd-numbered positions in the second sequence; and
the second memory part and the fourth memory part are located at even-numbered positions in the second sequence.

6. The imaging device according to claim 1, wherein:
the first counter part and the third counter part correspond to low-order bits of the digital signal; and
the second counter part and the fourth counter part correspond to high-order bits of the digital signal.

7. The imaging device according to claim 1, wherein transfer from the first counter part to the first memory part and transfer from the second counter part to the second memory part are performed in response to a same signal.

8. The imaging device according to claim 1, wherein transfer from the first counter part to the first memory part is performed at a first timing, transfer from the second counter part to the second memory part being performed at a second timing different from the first timing.

9. The imaging device according to claim 1, wherein:
the imaging device has a first operation mode and a second operation mode;
in the first operation mode, transfer from the first counter part to the first memory part and transfer from the second counter part to the second memory part are performed in response to a same signal; and
in the second operation mode, transfer from the first counter part to the first memory part is performed at a first timing, transfer from the second counter part to the second memory part being performed at a second timing different from the first timing.

10. A camera system comprising:
an imaging device including
a pixel that outputs a pixel signal corresponding to incident light;
a comparator that compares the pixel signal with a reference signal and generates an output signal that indicates a comparison result,
a counter that generates a digital signal corresponding to the pixel signal by counting the number of periods until the output signal is inverted, the counter including first to fourth counter parts, each of which corresponds to one of a plurality of bits included in the digital signal,
a memory that stores the digital signal, the memory including a first memory part corresponding to the first counter part, a second memory part corresponding to the second counter part, a third memory part corresponding to the third counter part, and a fourth memory part corresponding to the fourth counter part,
a first wiring line, and
a second wiring line different from the first wiring line; and
a camera signal processor that processes a signal output from the imaging device, wherein
the first counter part is connected to the first memory part through the first wiring line, the third counter part is connected to the third memory part through the first wiring line, the second counter part is connected to the second memory part through the second wiring line, and the fourth counter part is connected to the fourth memory part through the second wiring line.

\* \* \* \* \*